United States Patent [19]

Nagano et al.

[11] 4,191,856
[45] Mar. 4, 1980

[54] ANALOG MULTIPLEXER

[75] Inventors: Katsumi Nagano; Yasuo Taguchi, both of Yokohama, Japan

[73] Assignee: Tokyo Shibaura Denki Kabushiki Kaisha, Kawasaki, Japan

[21] Appl. No.: 929,022

[22] Filed: Jul. 28, 1978

[30] Foreign Application Priority Data

Jul. 29, 1977 [JP] Japan .................................. 52-91150

[51] Int. Cl.² .......................... H03K 19/40; H04J 3/04
[52] U.S. Cl. .............................. 179/15 A; 179/15 BL; 307/243; 340/147 CN
[58] Field of Search ......................... 179/15 A, 15 BL; 307/243, 244; 340/147 CV, 147 CN

[56] References Cited

U.S. PATENT DOCUMENTS

| | | | |
|---|---|---|---|
| 3,535,458 | 10/1970 | Gottfried | 179/15 BL |
| 3,838,296 | 9/1974 | McLeod | 179/15 A |

*Primary Examiner*—David L. Stewart
*Attorney, Agent, or Firm*—Finnegan, Henderson, Farabow & Garrett

[57] ABSTRACT

Disclosed is an analog multiplexer in which a plurality of emitter follower differential amplifiers formed of several pairs of bipolar transistors connected in parallel with each other are connected in common to one terminal of a power source through a current mirror load circuit, and to the other terminal of the power source via a switch circuit and a constant-current source. The switch circuit is to connect the constant-current source selectively to the common conjunction of the emitters of each pair of emitter follower differential amplifiers.

6 Claims, 6 Drawing Figures

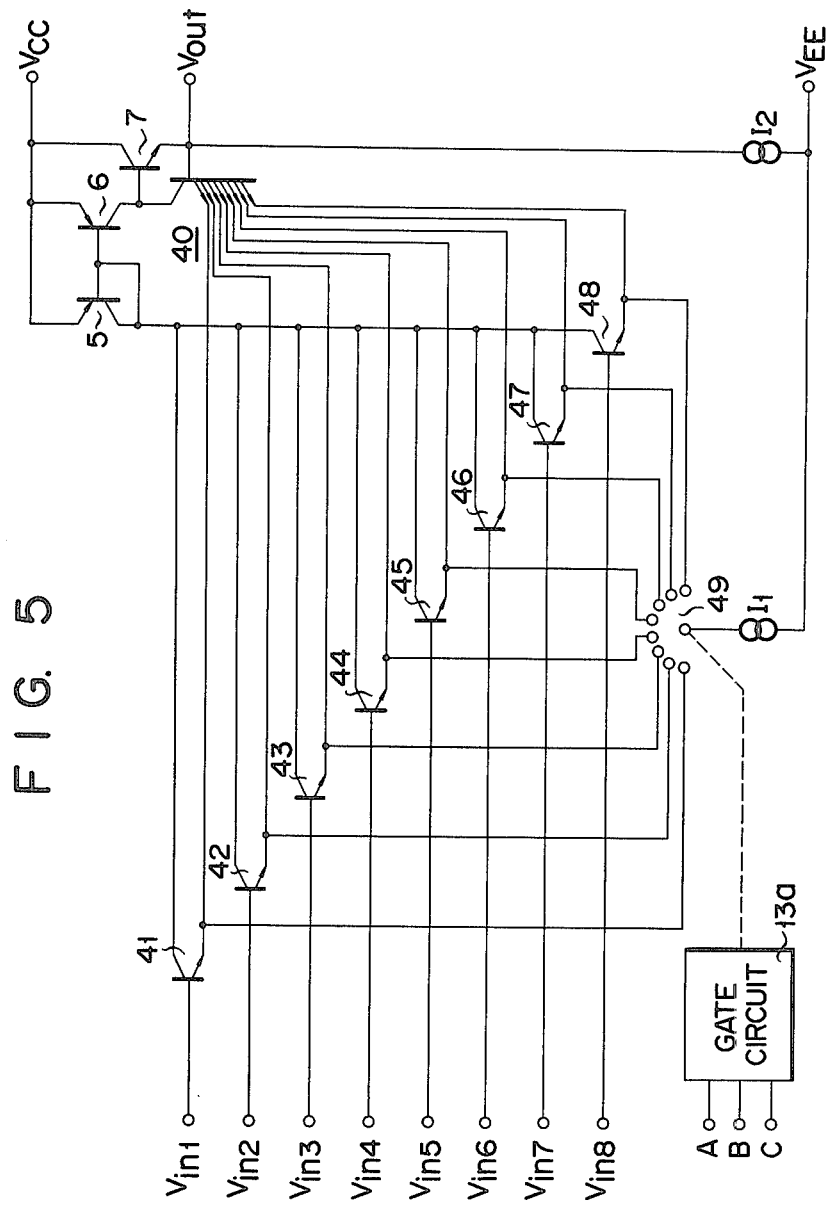
F I G. 5

ANALOG MULTIPLEXER

BACKGROUND OF THE INVENTION

This invention relates to an analog multiplexer capable of selectively producing one among a plurality of analog signals.

In a prior art analog multiplexer, for example, the sources of a plurality of MOS transistors are connected with one another, the drains of the transistors are supplied with varied analog signals as input signals, and a control signal is supplied to the gate of one of those MOS transistors, whereby the analog voltage supplied to the drain of such transistor is obtained at the source side. That is, an MOS transistor with its drain supplied with a desired analog signal is caused to conduct to derive a potential from the drain to the source of the MOS transistor, thereby ensuring the function of the analog multiplexer. The conduction resistance of the MOS transistor in conduction varies from approximately 100Ω to 1 kΩ depending on the elements. Therefore, in such conventional analog multiplexer, the conduction resistance of the MOS transistor causes a voltage drop in the analog signal to enlarge the difference between the input and output signals, thereby reducing the accuracy. Further, the circuit construction is relatively complicated, while the response of the output to the input is slow.

SUMMARY OF THE INVENTION

Accordingly, the object of this invention is to provide an analog multiplexer of simple construction, which is highly accurate, has a reduced difference between the input and output signals, and is quick to respond.

According to this invention, there is provided an analog multiplexer which comprises at least one emitter follower differential amplifier composed of first and second bipolar transistors the emitters of which are connected in common, an analog signal input terminal connected to the base of the first bipolar transistor, an analog output terminal connected to the base of the second bipolar transistor, a load composed of a current mirror connected between the collectors of the first and second bipolar transistors and one terminal of a power source, a switch circuit with one terminal connected to the common junction of the emitters of the first and second bipolar transistors and the other terminal connected to the other terminal of the power source through a first constant-current surce, a control circuit for controlling the switch circuit, an output circuit connected between the analog output terminal and the one terminal of the power source, and a second constant-current source connected between the analog output terminal and the other terminal of the power source.

BRIEF DESCRIPTION OF THE DRAWINGS

FIG. 5 is a circuit diagram of still another embodiment of the invention; and

DETAILED DESCRIPTION OF THE PREFERRED EMBODIMENTS

Now there will be described in detail embodiments of this invention with reference to the accompanying drawings.

Figure 1:
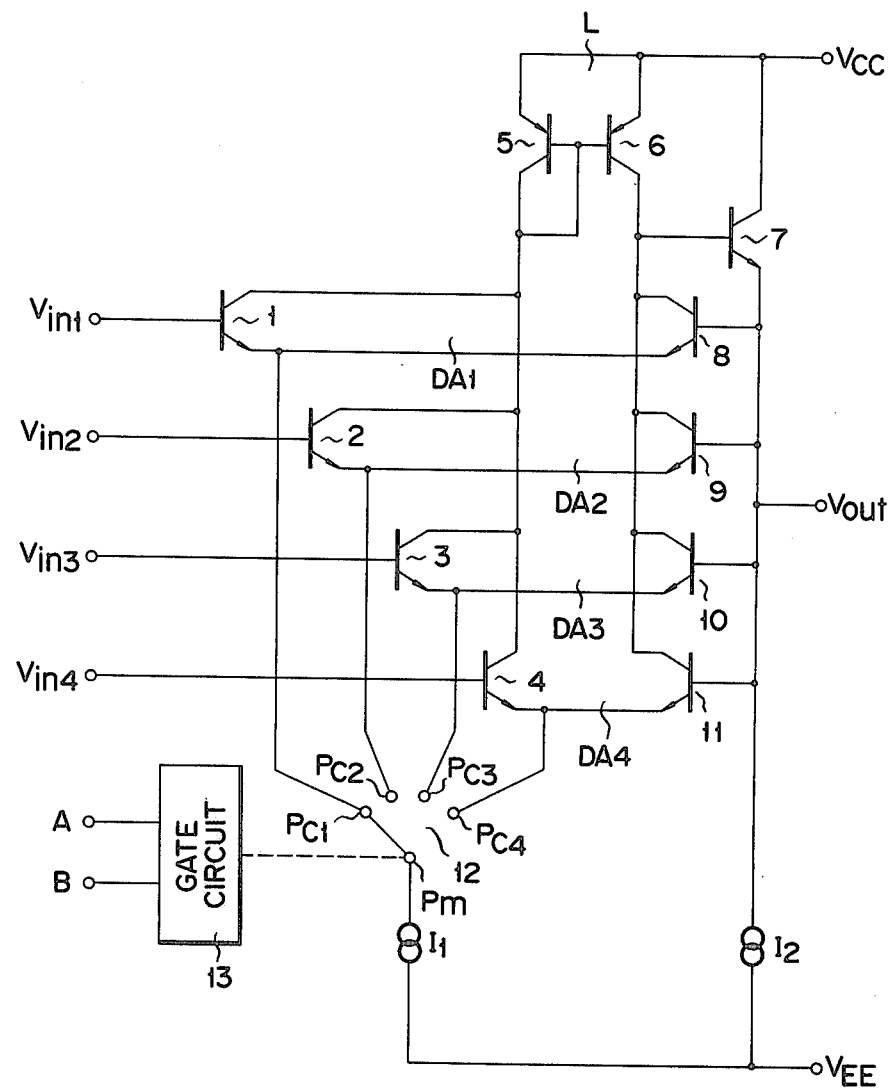
FIG. 1 is a circuit diagram showing the constitutional principle of this invention.

Referring to FIG. 1, there is shown a 4-channel analog multiplexer which selects one among four analog input signals Vin1 to Vin4. Numerals 1 to 4 designate npn-type transistors having their respective bases supplied with the analog input signals Vin1 to Vin4 respectively. The respective collectors of the transistors 1 to 4 are connected with one another, and their several junctions are connected with the collector of a pnp-type transistor 5 with its emitter connected to a power source Vcc. The collector of the transistor 5 is connected with its base, which is connected to the base of a pnp-type transistor 6 the emitter of which is connected to the power source Vcc. The collector of the transistor 6 is connected with the base of an npn-type transistor 7 the collector of which is connected to the power source Vcc, and also is connected in parallel with the individual collectors of npn-type transistors 8 to 11 the bases of which are connected with the emitter of the transistor 7. The respective emitters of the transistors 8 to 11 are connected with the respective emitters of the transistors 1 to 4 supplied with the analog input signals Vin1 to Vin4 respectively. That is, the pairs of transistors 1 and 8, 2 and 9, 3 and 10, and 4 and 11 form differential amplifiers DA1 to DA4 respectively. The several pairs of emitters of the transistors 1 and 8, 2 and 9, 3 and 10, and 4 and 11 are connected to fixed contacts Pc1 to Pc4 of a switch 12, respectively. A constant-current source I1 is disposed between a movable contact Pm of the switch 12 and a power source $V_{EE}$. Further, a constant-current source I2 is disposed between the power source $V_{EE}$ and the junctions of the emitter of the transistor 7 and the respective bases of the transistors 8 to 11. The constant-current source I2 is a current sink for output signals which cooperates with the transistor 7 to produce positive and negative currents as outputs. The operation of the switch 12 is controlled by driving signals produced from a gate circut 13 which serves as a decoder. The gate circuit 13, which is to generate the driving signals for the selective operation of the switch 12 by combining two binary signals or level signals A and B supplied from the outside, produces such a driving signal that allows the movable contact Pm of the swich 12 to be connected with the fixed contact Pc1 when both those level signals are at a high level "1," for example. Likewise, the gate circuit 13 produces a driving signal to connect the movable contact Pm with the fixed contact Pc2 of the switch 12 when the level signal A is at the high level "1" and the level signal B is at a low level "0." Further, the gate signal circuit 13 produces a driving signal to connect the movable contact Pm with the fixed contact Pc3 when the level signal A is at the low level "0" and the level signal B is at the high level "1." Furthermore, the gate circuit 13 produces a driving signal to connect the movable contact Pm with the fixed contact Pc4 when both the level signals A and B are at the low level "0." That is, the above-mentioned circuit includes four voltage followers connected in series with one another, having the transistors 5 to 7 as a common load L and the constant-current sources I1 and I2 in common. Thus, an output signal Vout is obtained from the junctions among the transistors 8 to 11.

Now there will be described the operation of the circuit constructed as aforesaid. Selected here, by way of example, is the analog input signal Vin1 supplied to the base of the transistor 1. First, the level signals A and B supplied from a control input terminal to the gate circuit 13 are both set at the high level. Then the gate circuit 13 supplies a predetermined driving signal to the switch 12. When the driving signal is supplied, the movable contact Pm of the switch 12 is connected to the fixed contact Pc1. Thereafter, a constant current I1 flows through the transistors 1 and 8 toward the constant-current source I1 via the transistors 5 and 6. That is, there is formed a voltage follower circuit with the transistors 5 and 6 as the load L and the transistors 1 and 8 as the differential amplifier DA1. Accordingly, an output signal Vout equivalent to the analog input signal Vin1 is obtained from the junctions of the bases of the transistors 8 to 11.

Subsequently, the level signals A and B are set at the high and low levels respectively. Then the gate circuit 13 supplies a predetermined driving signal to the switch 12. When the driving signal is supplied, the movable contact Pm of the switch 12 is connected to the fixed contact Pc2. Thereafter, the constant current I1 flows through the transistors 2 and 9 toward the constant-current sink I1. That is, there is formed a voltage follower circuit with the transistors 5 to 7 as the load L and the transistors 2 and 9 as the differential amplifier DA2.

Accordingly, an output signal Vout equivalent to the analog input signal Vin2 is obtained from the junctions of the bases of the transistors 8 to 11. Similarly, if the level signals A and B are set at the low and high levels respectively, there will be formed a voltage follower circuit with the transistors 5 to 7 as the load L and the transistors 3 and 10 as the differential amplifier DA3, and an output signal Vout equivalent to the analog input signal Vin3 will be obtained from the junctions of the bases of the transistors 8 to 11. Moreover, if the level signals A and B are both set at the low level, there will be formed a voltage follower circuit with the transistors 5 to 7 as the load L and the transistors 4 and 11 as the differential amplifier DA4, and an output signal Vout equivalent to the analog input signal Vin4 will be obtained from the junctions of the bases of the transistors 8 to 11.

Figure 2:
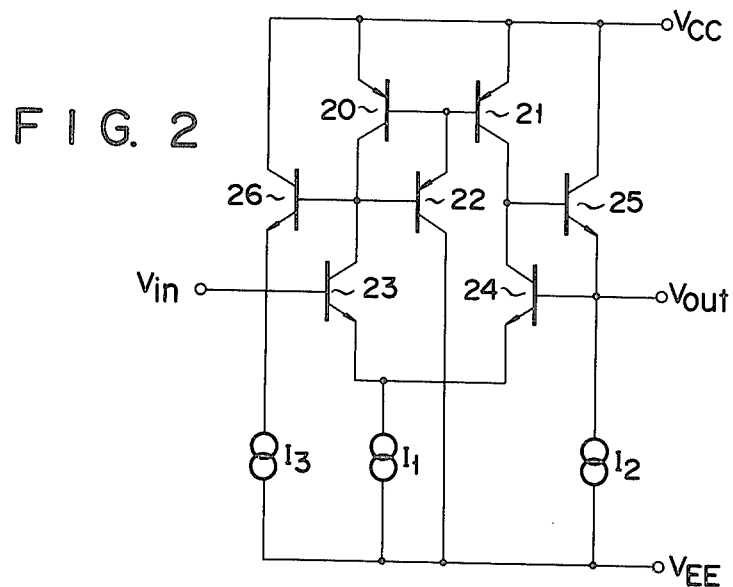
FIG. 2 is a circuit diagram showing the basic circuit of the principal part among the components as shown in FIG. 1.

Meanwhile, the question here is the differences between the analog input signals Vin1 to Vin4 and the output signal Vout. FIG. 2 is a block diagram showing the basic circuit of a voltage follower circuit extracted from the 4-channel analog multiplexer as shown in FIG. 1. The voltage follower circuit as shown in FIG. 2 comprises a current repeater composed of pnp-type transistors 20 and 21 with the emitters connected to the power source Vcc and the bases connected with each other and a pnp-type transistor 22 with the emitter and base connected to the base and collector of the transistor 20 respectively and the collector connected to the power source $V_{EE}$; a differential amplifier composed of npn-type transistors 23 and 24 with the collectors connected to the collectors of the transistors 20 and 21 respectively and the emitters connected with one another, the junction between the emitters being connected to the power source $V_{EE}$ through the constant-current source I1; an npn-type transistor 25 with the collector connected to the power source Vcc, the base connected to the collector of the transistor 24, and the emitter connected to the base of the transistor 24 and to the power source $V_{EE}$ through the constant-current source I2; and an npn-type transistor 26 with the collector connected to the power source Vcc, the base connected to the collector of the transistor 23, and the emitter connected to the power source $V_{EE}$ through a constant-current source I3. Thus, an output signal Vout may be obtained from the junction of the base of the transistor 24 and the emitter of the transistor 25.

In the voltage follower circuit of the aforementioned construction, the difference between the input signal Vin and the output signal Vout is equivalent to the input offset voltage of the differential amplifier formed of the transistors 23 and 24. The generation of the input offset voltage is attributable to the input to output current ratio of the current repeater not being precisely unity and that a difference is caused between the emitter currents of the transistors 23 and 24 forming the difference amplifier due to the current at the output terminal. Calculating the input offset voltage at room temperature, there are found very small values; 0.80 mV with the output terminal current of 30 $\mu$A, 0.06 mV with 0 $\mu$A, and $-0.68$ mV with $-30$ $\mu$A. Therefore, in the 4-channel analog multiplexer as shown in FIG. 1, the differences between the analog input signals Vin1 to Vin4 and the output signal Vout may be small.

Figure 3:
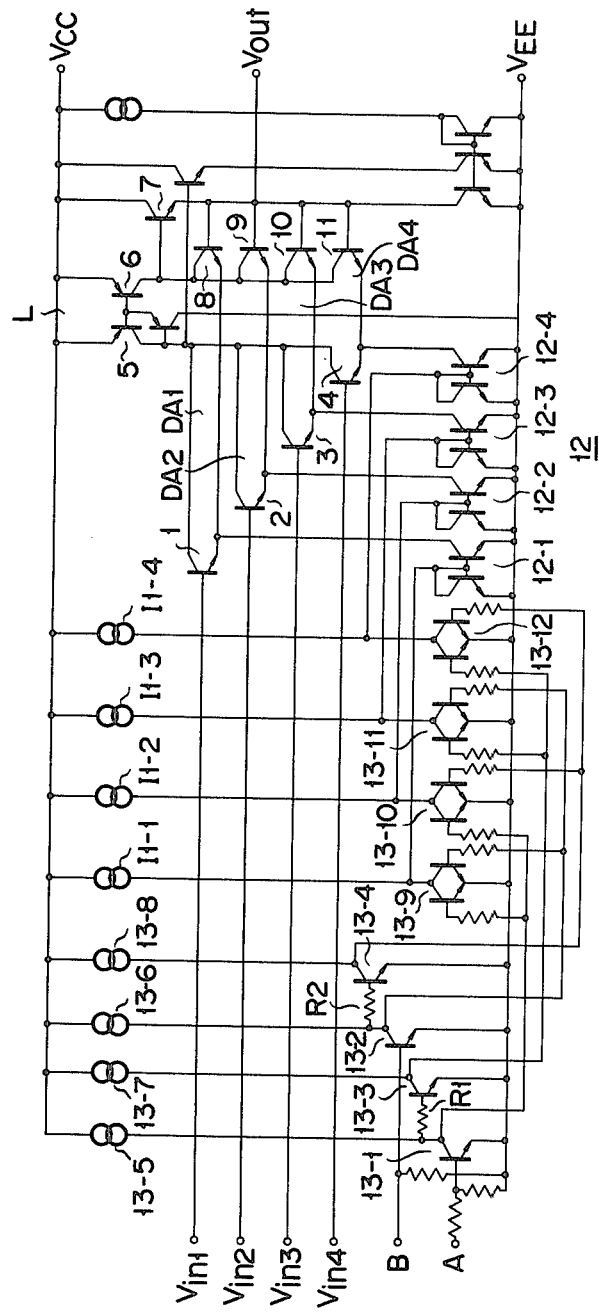
FIG. 3 is a circuit diagram of an embodiment of the invention.

FIG. 3 shows an embodiment of the circuit of FIG. 1, in which the corresponding parts are denoted by like reference numerals. In FIG. 3, the switch circuit 12 includes switch circuit elements 12-1, 12-2, 12-3 and 12-4 each consisting of a pair of transistors, and four separate constant-current sources I1-1, I1-2, I1-3 and I1-4 are used for the constant-current source I1. The gate circuit 13 includes transistors 13-1 and 13-2 with the bases connected to control input terminals A and B and transistors 13-3 and 13-4 with the bases connected to the respective collectors of the transistors 13-1 and 13-2 through resistances R1 and R2, the collectors of the transistors 13-1 to 13-4 being connected to the power source Vcc through constant-current sources 13-5, 13-6, 13-7 and 13-8 respectively. The gate circuit 13 further includes four transistor switch circuits 13-9, 13-10, 13-11 and 13-12 formed of four pairs of or eight transistors with their bases connected to the respective collectors of the transistors 13-1 to 13-4 through their corresponding resistances.

In FIG. 3, when the signals A and B are both at the high level "1," for example, the transistors 13-1 and 13-2 are caused to conduct to connect the constantcurrent sources 13-5 and 13-6 to the power source $V_{EE}$ and to connect the bases of one side of the transistor switch circuits 13-10 and 13-11 as well as both transistors of the circuits 13-9 to the power source $V_{EE}$, thereby turning these transistors off. Consequently, the transistor switch circuit 13-9 only is rendered nonconducting because both of its transistors are turned off, while the constant-current source I1-1 only is connected to the switch circuit element 12-1, whereby an analog output corresponding to the analog voltage Vin1 supplied to the base of the transistor 1 is obtained from the output terminal Vout.

Meanwhile, when the signals A and B are at the levels "0" and "1" respectively, the transistor 13-2 only is allowed to conduct to connect the constantcurrent source 13-6 to the power source $V_{EE}$, and one side of the transistor switch circuits 13-9 and 13-11 are turned off. Since the transistor 13-1 is off, the transistor 13-3 is turned on, and the other side of the transistor switch circuit 13-11 and one side of 13-12 are turned off. Consequently, both transistors of the transistor circuit 13-11 are turned off to connect only the constant-current source I1-3 to the switch circuit element 12-3, whereby an analog output corresponding to the analog input Vin3 supplied to the base of the transistor 1 is obtained from the output terminal Vout.

Figure 4:
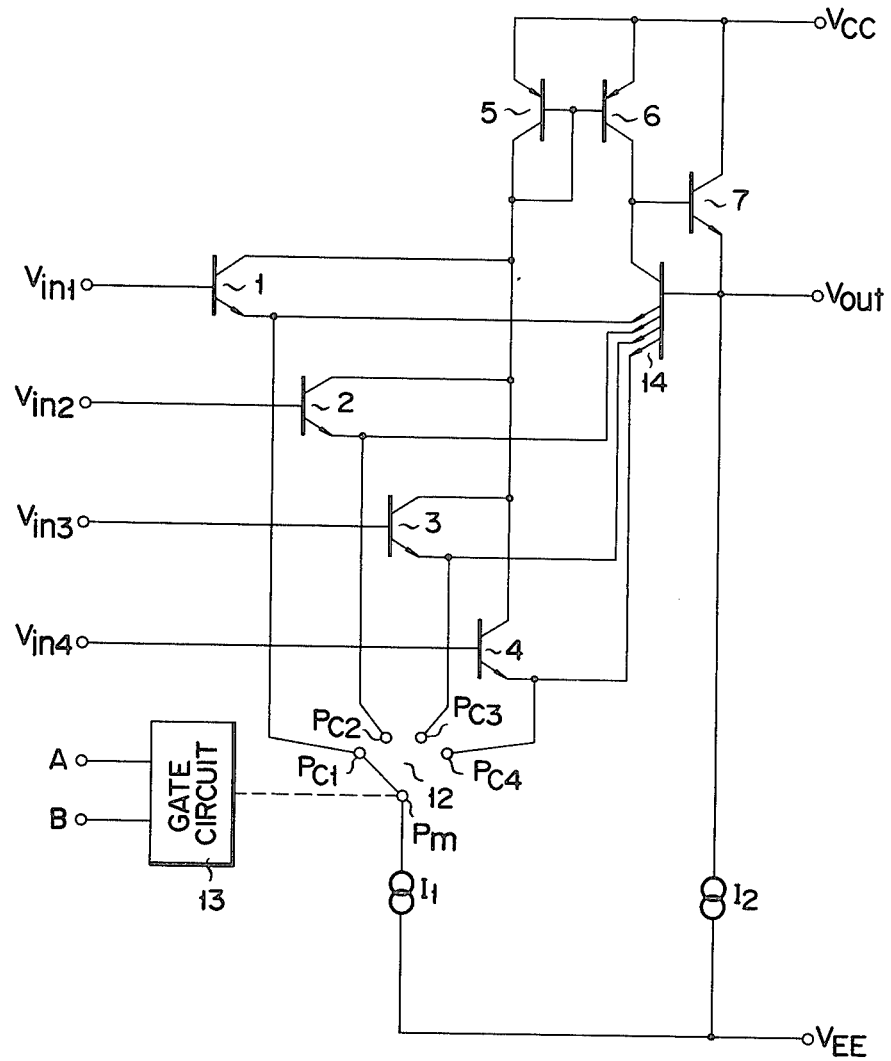
FIG. 4 is a circuit diagram of another embodiment of the invention.

FIG. 4 is a block diagram showing another embodiment of the invention which differs from the circuit of FIG. 1 in that transistors 8 to 11 forming the four differential amplifiers DA1 to DA4 are replaced by a multi-emitter transistor 14 with four emitters. Although in this case the difference may be somewhat increased, the number of elements will be reduced.

FIG. 5 is a block diagram showing still another embodiment of the invention or an 8-channel analog multiplexer with analog input signals Vin1 to Vin8, which differs from the aforementioned 4-channel multiplexer in that three level signals A, B and C are required for the supply of the gate circuit 13.

Figure 6:
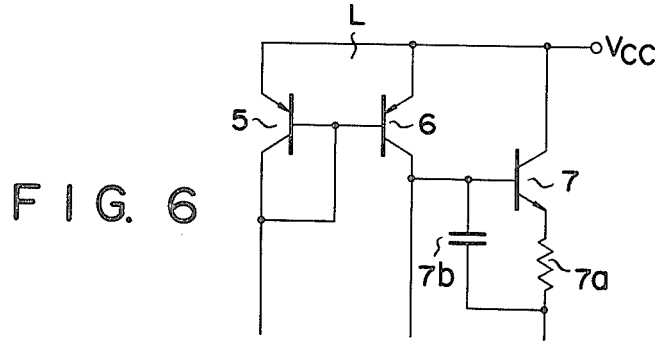
FIG. 6 is a circuit diagram showing an alternative example of the embodiment of FIG. 3.

Hereupon, if the currents flowing through the constant-current sources I1 and I2 of the circuit of FIG. 1 exceed 30 $\mu$A, for example, oscillation may be caused provided the gain of the output transistor 7 is large enough. FIG. 6 shows an oscillation preventer circuit for preventing such oscillation which includes a resistance 7a with one end connected to the emitter circuit of the output transistor 7 and a capacitor 7b connected between the base of the transistor 7 and the other end of the resistance 7a. Although the response speed of the circuit is a little lowered by inserting such oscillation preventer circuit, the two merits of this invention—capability of obtaining output currents and availability of the bipolar transistor for the output circuit—are not missed, since the bipolar transistor is used in the output circuit.

According to this invention, as described above in detail, there may be provided a high-accuracy analog multiplexer of simple construction which comprises a plurality of voltage follower circuits supplied with analog signals as input signals and connected in parallel with one another and a means for switching constant-current sources to supply the voltage follower circuits for the selective operation thereof, and which enables reduction in the difference between the input and output signals as well as high-speed response by selectively operating the switching means to produce a specified analog input signal at the output side of a specified voltage follower circuit.

What we claim is:

1. An analog multiplexer comprising at least one differential circuit composed of first and second bipolar transistors the emitters of which are connected in common, an analog signal input terminal connected to the base of said first bipolar transistor, an analog output terminal connected to the base of said second bipolar transistor, a load composed of a current mirror connected between the collectors of said first and second bipolar transistors and one terminal of a power source, a first constant-current source, a switch circuit with one terminal connected to the common junction of the emitters of said first and second bipolar transistors and the other terminal connected to the other terminal of said power source through a first constantcurrent source, control circuit means for controlling the conductivity between said terminals of said switch circuit, output circuit means responsive to the signal at said collector of said second bipolar transistor for connecting said one terminal of the power source to said analog output terminal, and a second constant-current source connected between said analog output terminal and said other terminal of the power source.

2. An analog multiplexer according to claim 1, wherein said control circuit means includes control input terminals supplied with a plurality of binary signals and a decoder supplied with said input binary signals to control said switch circuit by a combination of said binary signals.

3. An analog multiplexer according to claim 1, wherein said output circuit means includes a third bipolar transistor.

4. An analog multiplexer according to claim 1, wherein said output circuit means comprises a third bipolar transistor having a base coupled to the collector of said second bipolar transistor, and an emitter-collector path coupled between said one terminal of said power supply and said analog output terminal, and said output circuit means further includes means for preventing oscillations comprising a resistance with one end connected in series with the emitter of said third bipolar transistor, and a capacitor connected between the other end of said resistance and the base of said third bipolar transistor.

5. An analog multiplexer according to claim 1, wherein said differential circuit is composed of a differential amplifier.

6. An analog multiplexer according to claim 1, wherein said current mirror includes a current repeater composed of third and fourth transistors having the emitters commonly connected to the one end of said power source and their bases connected with each other, a fifth transistor having an emitter connected to a connection point of the bases of the third and fourth transistors and a collector connected to the other end of the power source, and a sixth transistor having a collector connected to the one end of the power source, a base connected to the base of the fifth transistor and an emitter connected to one end of the first constantcurrent source.

* * * * *